(12) United States Patent
    Yusuf

(10) Patent No.: US 12,562,713 B2
(45) Date of Patent: Feb. 24, 2026

(54) ACOUSTIC RESONATOR STRUCTURE WITH IMPROVED TEMPERATURE COEFFICIENT OF FREQUENCY (TCF)

(71) Applicant: Qorvo US, Inc., Greensboro, NC (US)

(72) Inventor: Yazid Yusuf, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 130 days.

(21) Appl. No.: 18/406,701

(22) Filed: Jan. 8, 2024

(65) Prior Publication Data

US 2024/0267024 A1 Aug. 8, 2024

Related U.S. Application Data

(60) Provisional application No. 63/483,224, filed on Feb. 3, 2023.

(51) Int. Cl.
    *H03H 9/17* (2006.01)
    *H03H 9/02* (2006.01)
(52) U.S. Cl.
    CPC ........ *H03H 9/172* (2013.01); *H03H 9/02102* (2013.01)
(58) Field of Classification Search
    CPC ..... H03H 9/172; H03H 9/02102; H03H 9/175
    See application file for complete search history.

(56) References Cited

U.S. PATENT DOCUMENTS

| | | | |
|---|---|---|---|
| 8,310,129 B2 | 11/2012 | Defay et al. | |
| 11,012,053 B2 | 5/2021 | Schiek et al. | |
| 11,146,247 B2 * | 10/2021 | Yusuf | H03H 9/584 |
| 2009/0017326 A1 | 1/2009 | Barber et al. | |
| 2011/0204996 A1 * | 8/2011 | Gilbert | H03H 9/587 |
| | | | 333/191 |
| 2019/0305752 A1 * | 10/2019 | Sadhu | H03H 9/17 |
| 2020/0220514 A1 * | 7/2020 | Kim | H10N 30/06 |
| 2022/0140817 A1 * | 5/2022 | Kreuzer | H03H 9/589 |
| | | | 333/189 |

FOREIGN PATENT DOCUMENTS

| | | |
|---|---|---|
| CN | 111917393 B | 6/2021 |
| DE | 10234980 B4 | 1/2018 |

\* cited by examiner

*Primary Examiner* — John W Poos
(74) *Attorney, Agent, or Firm* — Haynes and Boone, LLP

(57) ABSTRACT

An acoustic resonator includes a first piezoelectric layer, a second piezoelectric layer, and a coupler layer between the first piezoelectric layer and the second piezoelectric layer. The first piezoelectric layer and the second piezoelectric layer have a same polarity. The coupler layer includes a first metal layer, a second metal layer, a dielectric layer between the first metal layer and the second metal layer, and conductive vias through the dielectric layer and electrically connecting the first metal layer and the second metal layer. A first electrode is positioned on the first piezoelectric layer opposite the coupler layer. A second electrode is positioned on the second piezoelectric layer opposite the coupler layer.

22 Claims, 7 Drawing Sheets

ACOUSTIC RESONATOR STRUCTURE WITH IMPROVED TEMPERATURE COEFFICIENT OF FREQUENCY (TCF)

CROSS-REFERENCE TO RELATED APPLICATIONS

This application claims the benefit of provisional patent application Ser. No. 63/483,224, filed Feb. 3, 2023, the disclosures of which is incorporated herein by reference in its entirety.

FIELD OF THE DISCLOSURE

The present disclosure relates to acoustic resonators, such as bulk acoustic wave (BAW) resonators, in particular, to BAW resonators capable of operating in high order modes with improved temperature coefficient of frequency (TCF).

BACKGROUND

Acoustic resonators, and particularly Bulk Acoustic Wave (BAW) resonators, are used in many high-frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G), 4th Generation (4G), and 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

Electrical loss in BAW resonators can negatively affect performance. To meet filtering requirements in certain applications (e.g., 5G networks), BAW resonators operating at higher frequencies (e.g., greater than 5 GHz) may require thinner electrodes and/or smaller resonator areas. However, reducing electrode thickness may result in increased resistance and/or electrical loss. In addition, reducing resonator areas and associated high power densities pose a challenge to BAW resonators' ability to handle high power.

One approach to reduce BAW resonator power density is to cascade multiple low impedance and large area resonators in series to realize an equivalent high impedance resonator. Another approach is to use BAW resonator structures that consist of multiple piezoelectric layers in which higher order modes are excited, which promises filters capable of operating at higher frequencies than if conventional, fundamental mode BAW resonators were used while maintaining reasonable quality factor, size, and electrode thickness. However, challenges still exist. For example, because a large percentage of energy is confined in the piezoelectric material in the cascaded structure, such BAW resonators may exhibit poor temperature coefficient of frequency (TCF). Additionally, high order mode operation may require polarity inversion in the piezoelectric layers, which poses fabrication difficulties. As advancements in high-frequency communication systems progress, the art continues to seek improved acoustic resonators and filter configurations capable of overcoming such challenges.

SUMMARY

Embodiments of the disclosure are directed to acoustic resonators, such as bulk acoustic wave (BAW) resonators, in particular, to BAW resonators capable of operating in high order modes with multiple piezoelectric layers and a coupler layer inserted between adjacent piezoelectric layers for improved temperature coefficient of frequency (TCF). With regard to modes (also known as eigenmodes) of operation, the terms "high order mode" and "higher order mode" are used interchangeably and are defined to mean a mode higher than the fundamental mode of a resonator, such as a second order mode, a third order mode, etc.

In one aspect, a BAW resonator includes a first piezoelectric layer, a second piezoelectric layer, and a coupler layer between the first piezoelectric layer and the second piezoelectric layer. The first piezoelectric layer and the second piezoelectric layer have a same polarity. The coupler layer includes a first metal layer, a second metal layer, a dielectric layer between the first metal layer and the second metal layer, and at least one conductive via electrically connecting the first metal layer and the second metal layer. A first electrode is positioned on the first piezoelectric layer opposite the coupler layer. A second electrode is positioned on the second piezoelectric layer opposite the coupler layer. In certain embodiments, the at least one conductive via is one of multiple conductive vias extending through the dielectric layer. In certain embodiments, the at least one conductive via form a ring extending around a perimeter of the dielectric layer. In certain embodiments, the dielectric layer includes a dielectric material having a positive temperature coefficient of velocity (TCV). In certain embodiments, the dielectric layer is an oxide layer. In certain embodiments, the BAW resonator is configured to excite a high order mode through the first piezoelectric layer, the coupler layer, and the second piezoelectric layer. In certain embodiments, a stress profile of the high order mode has approximately a first half wavelength in the first piezoelectric layer, approximately a second half wavelength in the coupler layer, and approximately a third half wavelength in the second piezoelectric layer. In certain embodiments, a stress profile of the high order mode has magnitudes of a first sign in the first piezoelectric layer and the second piezoelectric layer and magnitudes of a second sign opposite to the first sign in the coupler layer. In certain embodiments, the BAW resonator further includes a first reflector on the first electrode opposite the first piezoelectric layer. In certain embodiments, the BAW resonator further includes a second reflector on the second electrode opposite the second piezoelectric layer. In certain embodiments, the first reflector includes a metal layer proximate the first electrode, a first conductive via connecting the metal layer to a first end of the first electrode, and a second conductive via connecting the metal layer to a second end of the first electrode. In certain embodiments, the first reflector further includes an insulating layer between the metal layer and the first electrode.

In another aspect, a BAW resonator includes a first piezoelectric layer, a second piezoelectric layer, a coupler layer between the first piezoelectric layer and the second piezoelectric layer, a first electrode on the first piezoelectric layer opposite the coupler layer, and a second electrode on the second piezoelectric layer opposite the coupler layer. The first piezoelectric layer and the second piezoelectric layer have a same polarity. A stress profile of a high order mode of the BAW resonator has magnitudes of a first sign in the first piezoelectric layer and the second piezoelectric layer, the stress profile has magnitudes of a second sign in the coupler layer, and the first sign is opposite to the second sign. In certain embodiments, the stress profile has a sinusoid portion through the first piezoelectric layer, the coupler layer, and the second piezoelectric layer with a first half wavelength in the first piezoelectric layer, a second half wavelength in the coupler layer, and a third half wavelength in the second piezoelectric layer. In certain embodiments, the first piezoelectric layer and the second piezoelectric layer have a same material composition. In certain embodiments, the coupler layer includes a first metal layer, a second metal layer, a dielectric layer or a piezoelectric layer between the first metal layer and the second metal layer, and at least one conductive via electrically connecting the first metal layer and the second metal layer. In certain embodiments, the coupler layer includes a first metal layer, a second metal layer, and a conductive layer between the first metal layer and the second metal layer. In certain embodiments, the BAW resonator further includes a Bragg reflector positioned proximate the first electrode.

In another aspect, an acoustic resonator structure includes a first piezoelectric layer, a second piezoelectric layer, a third piezoelectric layer, a first coupler layer between the first piezoelectric layer and the second piezoelectric layer, a second coupler layer between the second piezoelectric layer and the third piezoelectric layer, a first electrode on the first piezoelectric layer opposite the first coupler layer, and a second electrode on the second piezoelectric layer opposite the second coupler layer. In certain embodiments, the first piezoelectric layer, the second piezoelectric layer, and the third piezoelectric layer have a same polarity. In certain embodiments, each of the first coupler layer and the second coupler layer includes a first metal layer, a second metal layer, a dielectric layer between the first metal layer and the second metal layer, and a conductive feature electrically connecting the first metal layer and the second metal layer. In certain embodiments, each of the first coupler layer and the second coupler layer includes a first metal layer, a second metal layer, a piezoelectric layer between the first metal layer and the second metal layer, and a conductive feature electrically connecting the first metal layer and the second metal layer. In certain embodiments, each of the first coupler layer and the second coupler layer includes a first metal layer, a second metal layer, and a conductive layer between the first metal layer and the second metal layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

Figure 2:
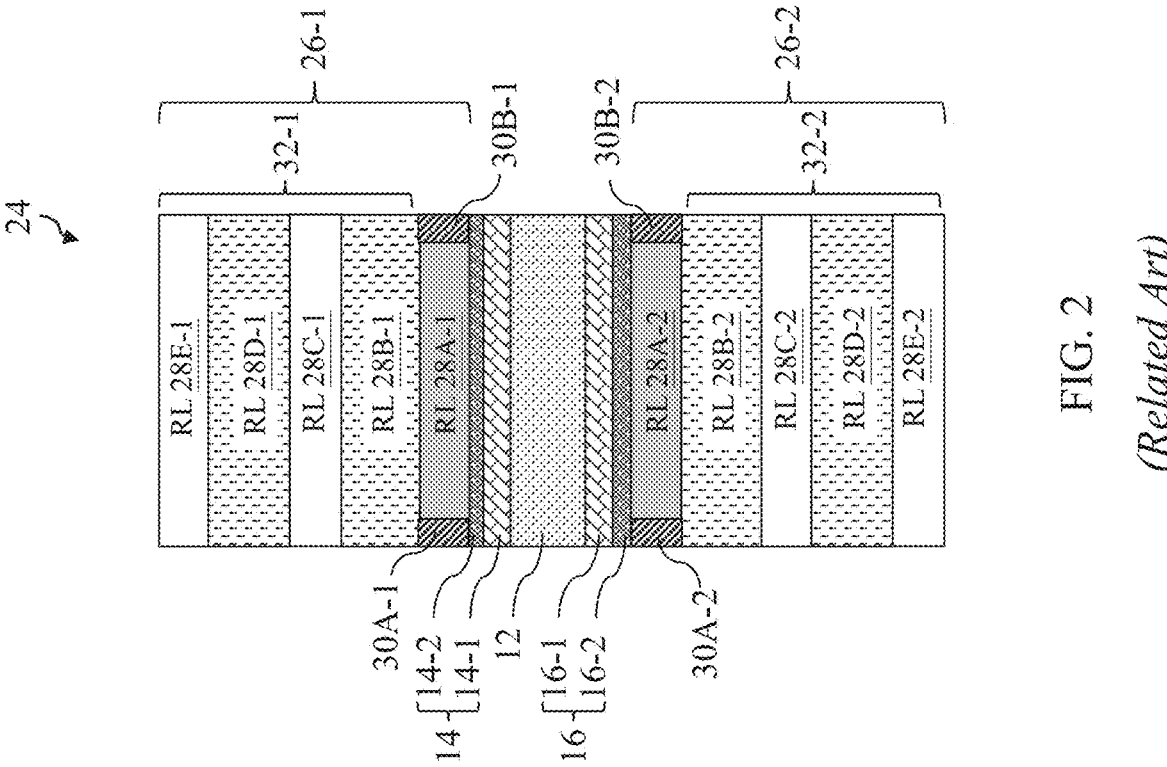
FIG. 2 illustrates a BAW resonator with top and bottom reflectors in which conductive layers of the reflectors form top and bottom conductive bridges.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. Additionally, like reference numerals denote like features throughout specification and drawings.

The present disclosure relates in various aspects to acoustic resonators, such as bulk acoustic wave (BAW) resonators and, in particular, to acoustic resonators operating at a high order mode with improved temperature coefficient of frequency (TCF). With regard to modes (also known as eigenmodes) of operation, the terms "high order mode" and "higher order mode" are used interchangeably and are defined to mean a mode higher than the fundamental mode of a resonator, such as a second order mode, a third order mode, etc. In exemplary aspects disclosed herein, an acoustic resonator operating at a high order mode includes two or more piezoelectric layers exhibiting the same polarization confined between a top electrode and a bottom electrode. Every two adjacent piezoelectric layers are separated by a multilayer stack (also referred to as a coupler layer) consisting of two metal layers between which there is a dielectric material exhibiting a positive temperature coefficient of velocity (TCV). The two metal layers in the multilayer stack are connected around the periphery of the resonator using one or more conductive vias, such as a metallic ring via. This forces the potential difference between the two metal layers to be zero and all the potential difference applied between the top and bottom electrodes drops across the piezoelectric layers. The thickness of the dielectric layer in the multilayer stack is designed such that the resonator operates in a high order mode where the stress field in the piezoelectric layers point in the same direction and opposite to the field in the sandwiched dielectric layer of the multilayer stack at the desired resonance frequency. The exemplary acoustic resonator structure has approximately twice the area of a conventional resonator operating at the fundamental mode, and therefore half the power density. This is highly desirable at higher frequencies where resonators are typically small and power densities are high. Additionally, the exemplary acoustic resonator structure has better TCF. Furthermore, the acoustic resonator structure does not require piezoelectric materials with different polarization which is advantageous since polarity inversion poses technical and fabrication challenges.

Figure 1:
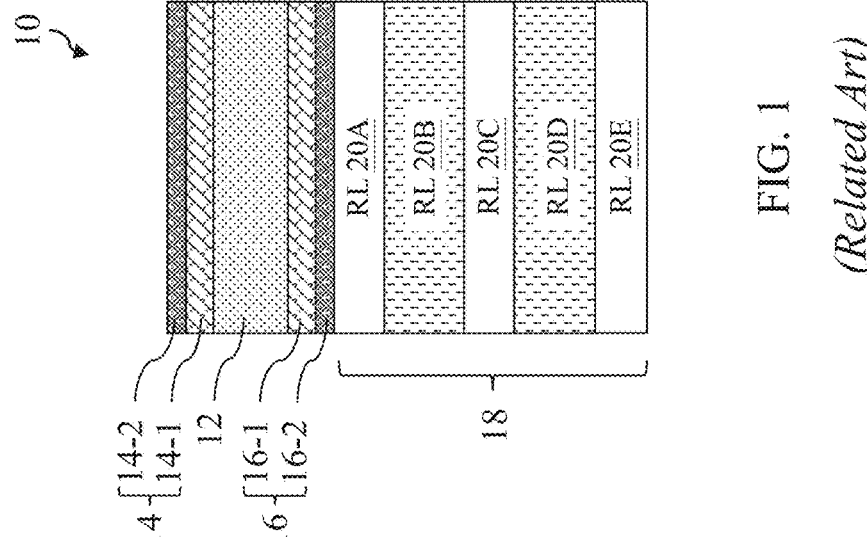
FIG. 1 illustrates a conventional bulk acoustic wave (BAW) resonator with a bottom reflector.

Prior to delving into the details of these concepts, an overview of BAW resonators and filters that employ BAW resonators is provided. BAW resonators are used in many high-frequency filter applications. A cross-sectional view of an exemplary BAW resonator 10 is illustrated in FIG. 1. The BAW resonator 10 is a solidly mounted resonator (SMR) type BAW resonator 10 and generally includes a piezoelectric layer 12, a top electrode 14 arranged on a top surface of the piezoelectric layer 12, a bottom electrode 16 arranged on a bottom surface of the piezoelectric layer 12, and a reflector 18 on which the bottom electrode 16 rests.

The top electrode 14 and the bottom electrode 16 sandwich the piezoelectric layer 12. The top electrode 14 and the bottom electrode 16 may be formed of tungsten (W), molybdenum (Mo), platinum (Pt), an aluminum alloy (e.g., AlCu), or like material, and the piezoelectric layer 12 may be formed of aluminum nitride (AlN), zinc oxide (ZnO), or other appropriate piezoelectric material. Further, each of the top electrode 14 and the bottom electrode 16 may include one or more sublayers having different electrical, mechanical, and/or acoustic properties. In one example, the top electrode 14 includes a first sublayer 14-1 in direct contact with the top surface of the piezoelectric layer 12 and a second sublayer 14-2 disposed on the first sublayer 14-1. The first sublayer 14-1 may be formed of W, Mo, or Pt, and the second sublayer 14-2 may be formed of AlCu. The first sublayer 14-1 may be thicker than the second sublayer 14-2. Similarly, the bottom electrode 16 includes a first sublayer 16-1 in direct contact with the bottom surface of the piezoelectric layer 12 and a second sublayer 16-2 disposed on the first sublayer 16-1. The first sublayer 16-1 may be formed of W, Mo, or Pt, and the second sublayer 16-2 may be formed of AlCu. The first sublayer 16-1 may be thicker than the second sublayer 16-2. In furtherance of the example, the sublayers 14-1 and 16-1 may have the same thickness and include the same metal, and the sublayers 14-2 and 16-2 may have the same thickness and include the same metal.

For the BAW resonator 10, applying electrical signals across the top and bottom electrodes 14, 16 excites acoustic waves in the piezoelectric layer 12. These acoustic waves primarily propagate vertically. A primary goal in BAW resonator design is to confine these vertically-propagating acoustic waves between the top and bottom electrodes 14, 16. Acoustic waves traveling upwardly are reflected back by the air-metal boundary at the top surface of the top electrode 14. Acoustic waves traveling downwardly are reflected back by the reflector 18. Alternatively in a Film BAW Resonator (FBAR) structure (not shown), acoustic waves traveling downwardly may be reflected back by an air cavity, which is provided just below the bottom electrode 16.

The reflector 18 is typically formed by a stack of reflector layers (RL) 20A through 20E (referred to generally as reflector layers 20), which alternate in material composition to produce a significant reflection coefficient at the junction of adjacent reflector layers 20. Typically, the reflector layers 20A through 20E alternate between materials having high and low acoustic impedances, such as tungsten (W) and silicon dioxide ($SiO_2$). The illustrated reflector 18 is also referred to as a Bragg reflector. While only five reflector layers 20A through 20E are illustrated in FIG. 1, the number of the reflector layers 20 and the structure of the reflector 18 may vary from one design to another.

FIG. 2 is a cross-sectional view of a BAW resonator 24 with a top Bragg reflector 26-1 proximate the top electrode 14 and a bottom Bragg reflector 26-2 proximate the bottom electrode 16 (referred to generally as reflectors 26). In certain embodiments, the top Bragg reflector 26-1 includes reflector layers 28A-1 to 28E-1, and the bottom Bragg reflector 26-2 includes reflector layers 28A-2 to 28E-2 (referred to generally as reflector layers 28). While only five reflector layers 28 in each of the reflectors 26 are illustrated, the number of the reflector layers 28 and the structure of the reflector 26 may vary. Although the top electrode 14 and the top Bragg reflector 26-1 are discussed in detail below, the discussion below also applies to the bottom electrode 16 and the bottom Bragg reflector 26-2.

The reflector layer 28A-1 includes an electrically insulating material. The reflector layers 28B-1 through 28E-1 include an electrically conductive material (e.g., highly conductive metallic materials). In this way, as the reflector layers 28B-1 through 28E-1 are electrically connected to each other, together the reflector layers 28B-1 through 28E-1 form a span portion 32-1. Top conductive vias 30A-1 and 30B-1 electrically connect the top electrode 14 to the reflector layer 28B-1. The top conductive vias 30A-1 and 30B-1 may be formed of metal of high electrical conductivity (e.g., AlCu). Accordingly, current flows through the top electrode 14 and separately flows through the top conductive via 30A-1 through the span portion 32-1 (i.e., the reflector layers 28B-1 through 28E-1) and through the top conductive via 30B-1. The top conductive vias 30A-1, 30B-1 and the span portion 32-1 collectively define a top conductive bridge. The top conductive bridge is offset from the top electrode 14 by an insulating volume defined by the reflector layer 28A-1. The top conductive bridge forms a top electrical loop between opposing ends (edges) of the top electrode 14. Such a configuration reduces electrical resistance, heat resistance, and/or ohmic losses for improved electrical loss of the BAW resonator structure.

Similarly, in the bottom Bragg reflector 26-2, the reflector layers 28B-2 through 28E-2 form a span portion 32-2. The bottom conductive vias 30A-2, 30B-2 and the span portion 32-2 collectively define a bottom conductive bridge. The bottom conductive bridge is offset from the bottom electrode 16 by an insulating volume defined by the reflector layer 28A-2.

As noted above, Bragg reflectors typically alternate between materials having high and low acoustic impedances. In certain embodiments, the reflector layer 28A-1 includes $SiO_2$, the reflector layers 28B-1 and 28D-1 include an aluminum alloy (e.g., AlCu), and the reflector layers 28C-1 and 28E-1 includes W. As part of a Bragg reflector, the reflector layers 28B-1 and 28D-1 exhibit relatively small stress/strain, and therefore acoustic losses in these layers are reduced.

Similarly, in certain embodiments, the reflector layer 28A-2 includes $SiO_2$, the reflector layers 28B-2 and 28D-2 include an aluminum alloy (e.g., AlCu), and the reflector layers 28C-2 and 28E-2 includes W.

Figures 3, 4:
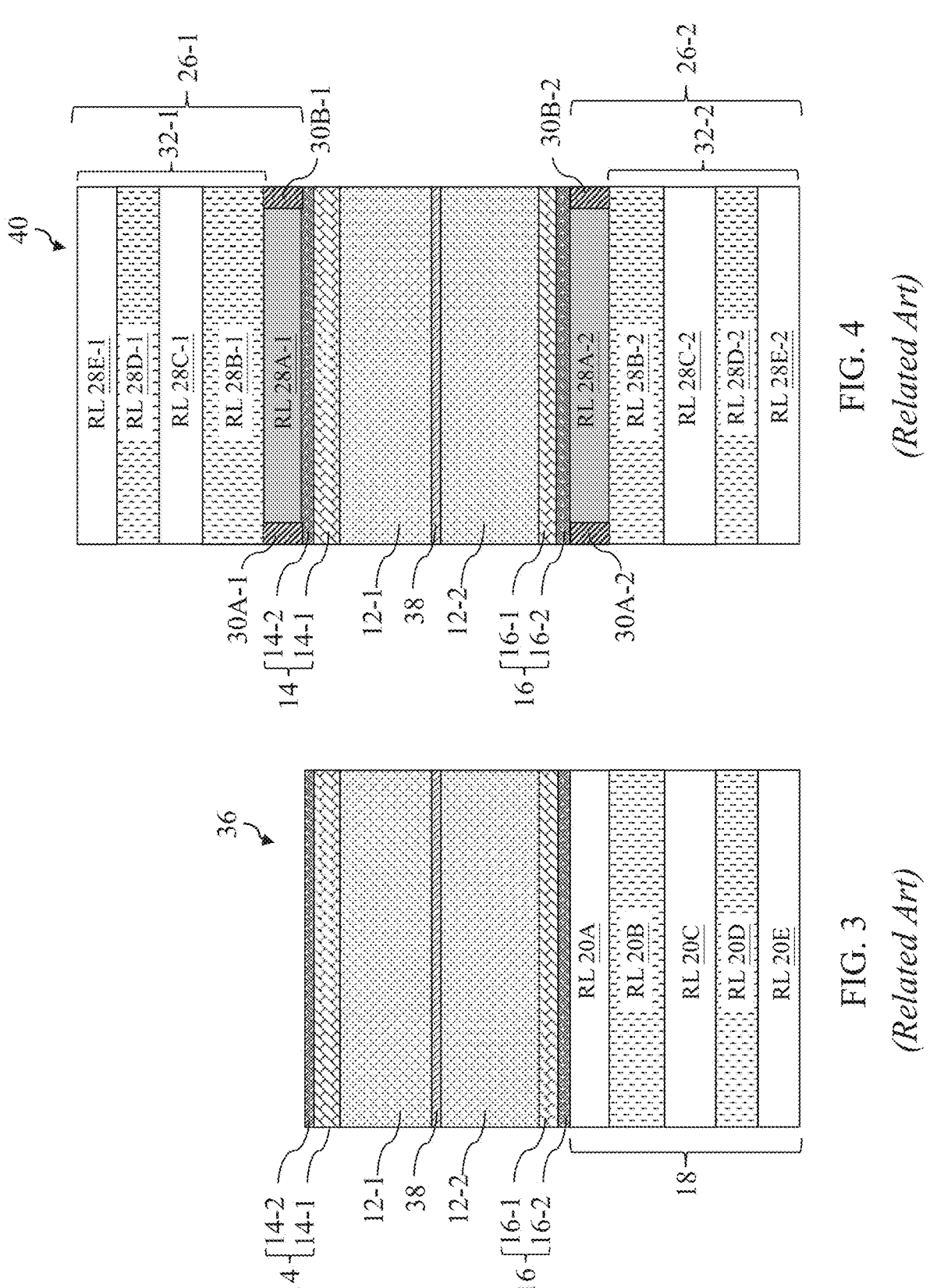
FIG. 3 illustrates a BAW resonator with two piezoelectric layers of opposite polarities for high order mode operation.
FIG. 4 illustrates a BAW resonator with two piezoelectric layers of opposite polarities for high order mode operation together with top and bottom reflectors in which conductive layers of the reflectors form top and bottom conductive bridges.

FIG. 3 is a cross-sectional view of a BAW resonator 36 that includes first and second piezoelectric layers 12-1 and 12-2 cascaded in series with a non-piezoelectric layer 38 inserted therebetween compared to the BAW resonator 10 of FIG. 1. Notably, the first piezoelectric layer 12-1 has a first polarity, while the second piezoelectric layer 12-2 has a second polarity that is opposite the first polarity. These polarities have opposing signs of the piezoelectric constant and therefore respond in opposite fashion to the electric field. This allows the BAW resonator 36 to excite a second order mode, because the stress field in the two piezoelectric layers points in opposite directions, and therefore opposite polarization is necessary in the two piezoelectric layers to excite this mode.

In one embodiment, the first piezoelectric layer 12-1 and the second piezoelectric layer 12-2 are aluminum nitride (AlN) layers having opposite polarities. For example, the first piezoelectric layer 12-1 may be a nitrogen polar layer of aluminum nitride (c-AlN), while the second piezoelectric layer 12-2 may be an aluminum polar layer of aluminum nitride (f-AlN). The aluminum nitride may be undoped or doped with one or more of scandium (Sc), erbium (Er), magnesium (Mg), hafnium (Hf), or the like.

To improve the electromechanical coupling coefficient of the BAW resonator 36, non-piezoelectric layer 38 is added between the first piezoelectric layer 12-1 and the second piezoelectric layer 12-2. The non-piezoelectric layer 38 provides a desired acoustic impedance between the first piezoelectric layer 12-1 and the second piezoelectric layer 12-2 in order to increase an integral of the stress profile of the BAW resonator 36 and thereby improve the electromechanical coupling coefficient thereof. In one embodiment, the non-piezoelectric layer 38 is a metal layer and may also be referred to as a shared electrode 38. The shared electrode 38 may be aluminum (Al), molybdenum (Mo), tungsten (W), or osmium (Os). Depending on the material chosen for the shared electrode 38, a thickness of the shared electrode 38 may be modified to provide a desired acoustic response in order to increase the electromechanical coupling coefficient of the BAW resonator 36. For example, a thickness of the shared electrode 38 may be smaller than that of the top electrode 14 or the bottom electrode 16.

FIG. 4 is a cross-sectional view of a BAW resonator 40 that includes first and second piezoelectric layers 12-1 and 12-2 cascaded in series with a non-piezoelectric layer 38 inserted therebetween compared to the BAW resonator 24 of FIG. 2. Similar to the BAW resonator 36 of FIG. 3, the polarities of the first piezoelectric layer 12-1 and the second piezoelectric layer 12-1 have opposing signs of the piezoelectric constant and therefore respond in opposite fashion to the electric field. This allows the BAW resonator 40 to excite a second order mode, because the stress field in the two piezoelectric layers points in opposite directions, and therefore opposite polarization is necessary in the two piezoelectric layers to excite this mode.

Figure 5:
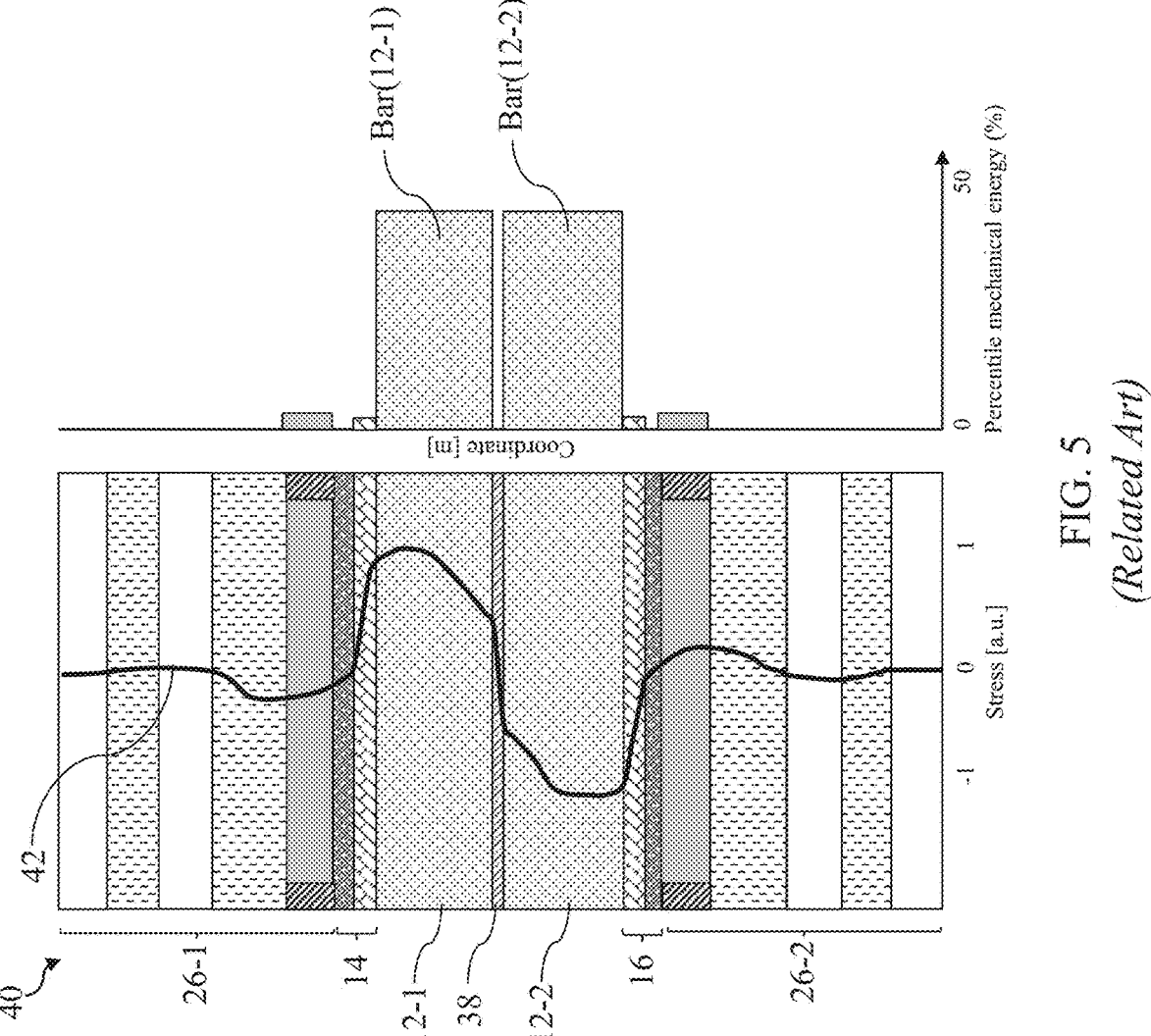
FIG. 5 illustrates a stress profile of a high order mode and a mechanical energy percentage profile of the BAW resonator as illustrated in FIG. 4.

FIG. 5 illustrates a stress profile (solid line 42) of the BAW resonator 40. As illustrated, the BAW resonator 40 operates in a second order mode, in which a stress profile corresponding with approximately a full wavelength of a sinusoid is fit within a thickness of the combination of the first piezoelectric layer 12-1, the second piezoelectric layer 12-2, and the shared electrode 38. The term "approximately" is defined to mean a nominal thickness within +/−five (5) percent of the value. Those skilled in the art will appreciate the stress profile may become steeper at the interface of the first piezoelectric layer 12-1 and the top electrode 14 and at the interface of the second piezoelectric layer 12-2 and the bottom electrode 16. The stress profile of the high order mode exhibits approximately a half wavelength in the first piezoelectric layer 12-1 and another half wavelength in the second piezoelectric layer 12-2. The stress field in the two piezoelectric layers 12-1, 12-2 points in opposite directions, and therefore opposite polarization is necessary in the two piezoelectric layers to excite the high order mode.

FIG. 5 also illustrates a bar diagram representing mechanical energy percentile in different regions of the BAW resonator 40. Notably, Bar (12-1) representing the mechanical energy confined in the first piezoelectric layer 12-1 and Bar (12-2) representing the mechanical energy confined in the second piezoelectric layer 12-2 each have a value close to 50%. That is, majority of the mechanical energy is confined in the two piezoelectric layers 12-1, 12-2.

Although the stress profile and the bar diagram of mechanical energy percentile of the BAW resonator 36 are omitted for the sake of simplicity, the BAW resonator 36 has the stress profile and the mechanical energy percentile similar to those of the BAW resonator 40 depicted in FIG. 5 in the combined regions of the first piezoelectric layer 12-1, the second piezoelectric layer 12-2, and the shared electrode 38.

In the BAW resonator 36 or 40, the two piezoelectric layers 12-1, 12-2 are electrically connected in series, which means that the resonator structure has approximately twice the electrical impedance of the above discussed reference resonator structure 10 or 24, assuming equal piezoelectric layer thicknesses and resonator area. Therefore, for the same impedance, the BAW resonator 36 or 40 should have twice the area of the reference resonator 10 or 24, resulting in more favorable power density. More specifically, the BAW resonator 36 or 40 exhibits one half the power density of the reference resonator 10 or 24, respectively.

In addition, in the BAW resonator 36 or 40, because a larger percentage of energy is confined in the piezoelectric material compared to the reference resonator 10 or 24, the BAW resonator 36 or 40 generally has a higher Q and higher electromechanical coupling. For the same reason, however, the BAW resonator 36 or 40 generally exhibits worse TCF compared with the reference resonator 10 or 24 which contains more percentage of energy in the oxide material, which exhibits positive TCV, as part of the reflectors. Further, polarity inversion required in the piezoelectric layers 12-1 and 12-2 in the BAW resonator 36 or 40 poses fabrication difficulties.

Figures 6, 7:
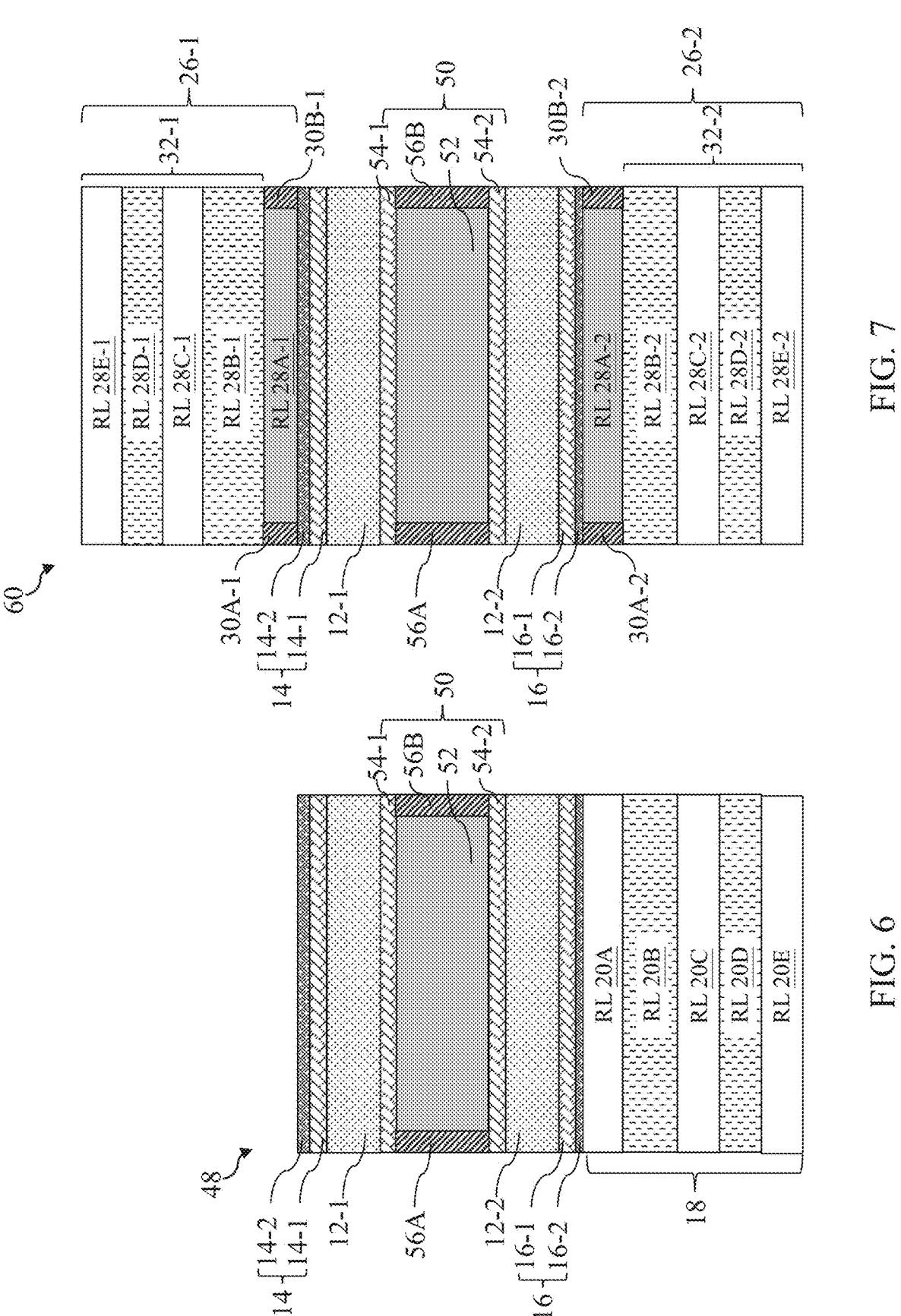
FIG. 6 illustrates a BAW resonator with two piezoelectric layers of the same polarity and a coupler layer embedded therebetween for high order mode operation.
FIG. 7 illustrates a BAW resonator with two piezoelectric layers of the same polarity and a coupler layer embedded therebetween for high order mode operation together with top and bottom reflectors in which conductive layers of the reflectors form top and bottom conductive bridges.

FIGS. 6 and 7 illustrate BAW resonator structures that include modifications to the configuration of cascaded piezoelectric layers such that the piezoelectric layers can have the same polarity by inserting a coupler layer with proper thickness between two adjacent piezoelectric layers. The thickness of the coupler layer is selected, such that the stress field in the piezoelectric layers point in the same direction and opposite to the field in the sandwiched dielectric layer of the coupler layer at the desired resonance frequency.

FIG. 6 illustrates a cross-sectional view of a BAW resonator 48 that includes a coupler layer 50 that replaces the shared electrode 38 compared to the BAW resonator 36 of FIG. 3. The coupler layer 50 is a multilayer stack inserted between the first piezoelectric layer 12-1 and the second piezoelectric layer 12-2. The piezoelectric layers 12-1 and 12-2 may be formed of aluminum nitride (AlN), zinc oxide (ZnO), or other appropriate piezoelectric material. Particularly, the piezoelectric layers 12-1 and 12-2 have the same polarity. For example, the piezoelectric layers 12-1 and 12-2 may have the same piezoelectric material. In one example, each of the piezoelectric layers 12-1 and 12-2 is a nitrogen polar layer of aluminum nitride (c-AlN). In another example, each of the piezoelectric layers 12-1 and 12-2 is an aluminum polar layer of aluminum nitride (f-AlN). The aluminum nitride may be undoped or doped with one or more of scandium (Sc), erbium (Er), magnesium (Mg), hafnium (Hf), or the like.

In the illustrated embodiment, the coupler layer 50 includes a dielectric layer 52, a top metal layer 54-1 arranged on a top surface of the dielectric layer 52, and a bottom metal 54-2 arranged on a bottom surface of the dielectric layer 52. The top metal layer 54-1 is arranged on a bottom surface of the first piezoelectric layer 12-1. The bottom metal layer 54-2 is arranged on a top surface of the second piezoelectric layer 12-2.

The dielectric layer 52 may be formed of an oxide layer exhibiting positive TCV. In one example the dielectric layer 52 is formed of $SiO_2$. The top metal layer 54-1 and the bottom metal layer 54-2 may be formed of tungsten (W), molybdenum (Mo), platinum (Pt), an aluminum alloy (e.g., AlCu), or like material. In one example, the top metal layer 54-1 and the sublayer 14-1 of the top electrode 14 include the same material, such as W. In furtherance of the example, the top metal layer 54-1 and the sublayer 14-1 of the top electrode 14 may have the same thickness, which also means the top metal layer 54-1 is thinner than the top electrode 14. Similarly, in one example, the bottom metal layer 54-2 and the sublayer 16-1 of the bottom electrode 16 include same material, such as W. In furtherance of the example, the bottom metal layer 54-2 and the sublayer 16-1 of the bottom electrode 16 may have the same thickness, which also means the bottom metal layer 54-2 is thinner than the bottom electrode 16.

The coupler layer 50 further includes conductive vias 56A and 56B that extend through the dielectric layer 52 and electrically connect the top metal layer 54-1 and the bottom metal layer 54-2. The conductive vias force the potential difference between the two metal layers 54-1, 54-2 to be zero and all the potential difference applied between the top and bottom electrodes 14, 16 drops across the piezoelectric layers 12-1, 12-2. The conductive vias 56A and 56B may be formed of metal of high electrical conductivity (e.g., AlCu).

Figure 8:
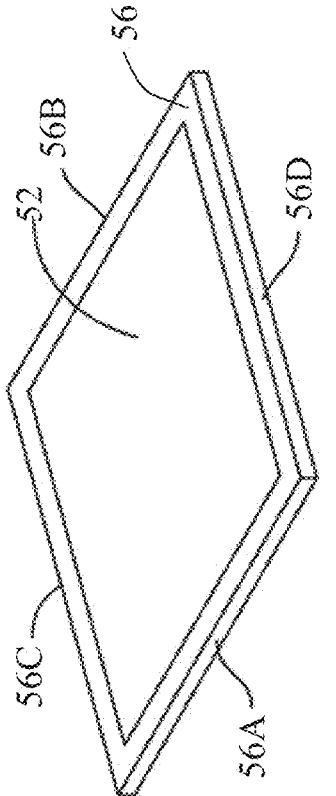
FIG. 8 illustrates a perspective view of a metallic ring via around a perimeter of a dielectric layer in a coupler layer of the BAW resonator as illustrated in FIG. 6 or FIG. 7.

While only two conductive vias 56A and 56B extending vertically between the top metal layer 54-1 and the bottom metal layer 54-2 are illustrated in FIG. 6, the number of conductive vias in the coupler layer 50 may vary from one design to another. In one example, the coupler layer 50 includes tens of conductive vias spread along the perimeter of the dielectric layer 52 and physically separated from one and another, such as in a fashion of conductive columns or posts. In another example, as illustrated in FIG. 8, the conductive vias (e.g., 56A, 56B, 56C, 56D) are actually different portions of a single metallic ring via, such as the ring via 56. The ring via 56 extends continuously around the perimeter of the dielectric layer 52, such that the dielectric layer 52 is confined within an inner sidewall of the ring via 56. The outer sidewall of the ring via 56 may flush with the sidewalls of the BAW resonator.

FIG. 7 illustrates a cross-sectional view of a BAW resonator 60 that includes a coupler layer 50 that replaces the shared electrode 38 compared to the BAW resonator 40 of FIG. 4. Similar to the BAW resonator 48 of FIG. 6, the polarities of the first piezoelectric layer 12-1 and the second piezoelectric layer 12-2 have the same signs of the piezoelectric constant and therefore respond in the same fashion to the electric field. The coupler layer 50 makes the high mode operation possible even with the first piezoelectric layer 12-1 and the second piezoelectric layer 12-1 having the same polarity. The thickness of the coupler layer 50 is selected, such that the stress field in the piezoelectric layers point in the same direction and opposite to the field in the sandwiched dielectric layer of the coupler layer at the desired resonance frequency.

Regarding the conductive vias 30 (e.g., vias 30A-1, 30B-1, 30A-2, 30B-2) in the Bragg reflector 26 and the conductive vias 56 (e.g., vias 56A, 56B) in the coupler layer 50, the conductive vias 30, 56 may have the same width measured in lateral direction and different heights measured in vertical direction. Depending on the thickness of the coupler layer 50, in one example, the conductive vias 30 may be shorter than the conductive vias 56; in another example, the conductive vias 30 may be taller than the conductive vias 56. The conductive vias 30 and 56 may include the same metal, such as AlCu. Alternatively, the conductive vias 30 and 56 may include different metals, such as Cu in the conductive vias 30, and AlCu in the conductive vias 56.

In some alternative embodiments, the layer 52 as shown in FIGS. 6 and 7 may be formed of material(s) other than dielectric materials to achieve different goals. For example, the layer 52 may be a piezoelectric layer. Piezoelectric materials generally exhibit better acoustic loss compared with dielectric materials. Using a piezoelectric material instead of a dielectric material may result in a higher quality factor for the resonator. For another example, the layer 52 may be conductive layer (e.g., a metal layer or a metal-containing conductive layer). Using a conductive material as the layer 52 simplifies fabrication of the resonator structure since the conductive vias 56 (e.g., vias 56A, 56B) are no longer needed. The principle of operation remains unchanged with the above choice of materials.

Figure 9:
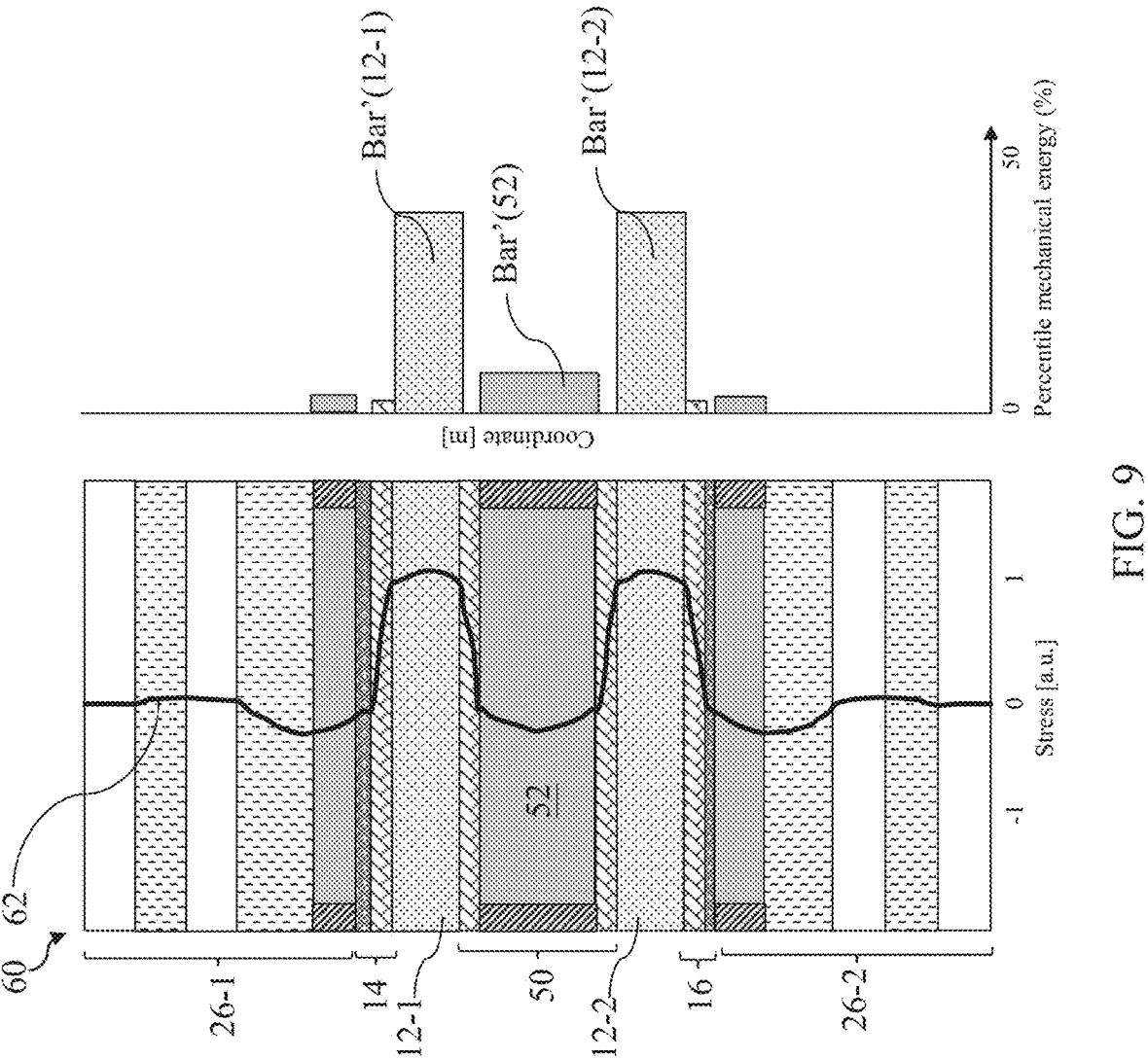
FIG. 9 illustrates a stress profile of a high order mode and a mechanical energy percentage profile of the BAW resonator as illustrated in FIG. 7.

FIG. 9 illustrates a stress profile (solid line 62) of the BAW resonator 60. As illustrated, the BAW resonator 60 operates in a high order mode, in which a stress profile corresponding with approximately one and a half wavelengths of a sinusoid are fit within a thickness of the combination of the first piezoelectric layer 12-1, the second piezoelectric layer 12-2, and the coupler layer 50. Those skilled in the art will appreciate the stress profile may become steeper at the interface of the first piezoelectric layer 12-1 and the top electrode 14, at the interface of the first piezoelectric layer 12-1 and the coupler layer 50, at the interface of the second piezoelectric layer 12-2 and the coupler layer 50, and at the interface of the second piezoelectric layer 12-2 and the bottom electrode 16. The stress profile of the high order mode exhibits approximately a first half wavelength in the first piezoelectric layer 12-1, a second half wavelength in the dielectric layer 52 of the coupler layer 50, and a third half wavelength in the second piezoelectric layer 12-2. The stress field in the two piezoelectric layers 12-1, 12-2 points in the same direction and opposite to the field in the sandwiched dielectric layer 52, and therefore no need for opposite polarization in the two piezoelectric layers to excite the high order mode, which simplifies the manufacturing processes. The thickness of the dielectric layer 52, and accordingly the thickness of the coupler layer 50, is selected based on the material compositions in the coupler layer 50, such that a half wavelength of the stress profile is approximately fit in the dielectric layer 52. Depending on the material compositions in the coupler layer 50, the dielectric layer 52 may be thicker than each of the piezoelectric layers 12-1, 12-2; alternatively, the dielectric layer 52 may be thinner than each of the piezoelectric layers 12-1, 12-2.

FIG. 9 also illustrates a bar diagram representing mechanical energy percentile in different regions of the BAW resonator 60. Notably, Bar'(52) representing the mechanical energy confined in the dielectric layer 52 of the coupler layer 50 has some substantive amount, such as in a range from 5% to 10% in one case, in a range from 10% to 15% in another case, and in a range from 5% to 15% in yet another case. While Bar'(12-1) representing the mechanical energy confined in the first piezoelectric layer 12-1 and Bar'(12-2) representing the mechanical energy confined in the second piezoelectric layer 12-2 each may still have a value above 40%, a substantive portion of the mechanical energy is confined in the oxide material having positive TCV in the dielectric layer 52, which improves the overall TCF performance.

Although the stress profile and the bar diagram of mechanical energy percentile of the BAW resonator 48 are omitted for the sake of simplicity, the BAW resonator 48 has the stress profile and the mechanical energy percentile similar to those of the BAW resonator 60 depicted in FIG. 7 in the combined regions of the first piezoelectric layer 12-1, the second piezoelectric layer 12-2, and the coupler layer 50.

The resonator structures 48 and 60 as illustrated in FIGS. 6 and 7 exhibit the same advantages of the previously discussed resonators 36 and 40 in FIGS. 3 and 4 in terms of larger resonator area and reduced power density. Since the structures contain more percentage of energy in the oxide material, the resonator structures 48 and 60 generally has improved TCF. Notably, the improved TCF may come with the cost of a lower Q and lower electromechanical coupling, for the same reason that the structure contains more percentage of energy in the oxide material. In some implementations, the disclosed resonator structures 48 and 60 may achieve a TCF of about −3 ppm/° C. —compared with −14.7 ppm/° C. as seen in some reference structures—and still maintain a satisfying electromechanical coupling coefficient of about 9.2%.

Figure 11:
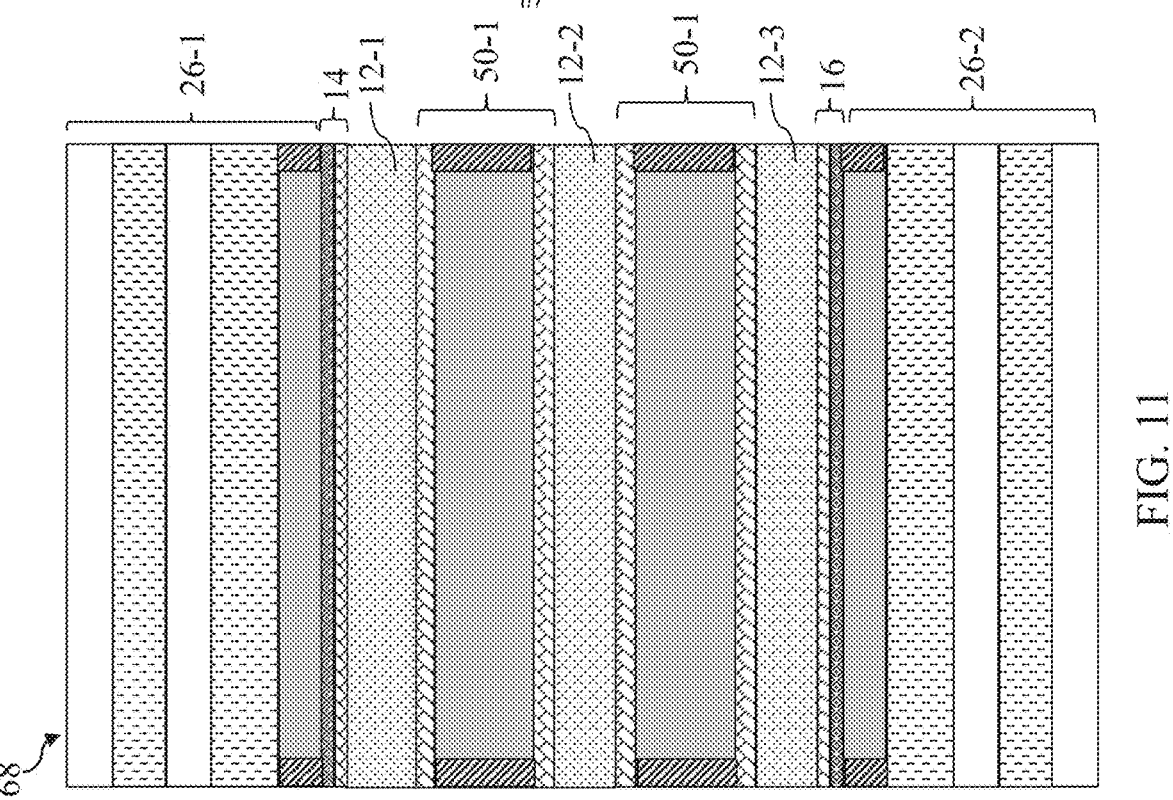
FIG. 11 illustrates a BAW resonator with three piezoelectric layers of the same polarity and two coupler layers embedded therebetween for high order mode operation together with top and bottom reflectors in which conductive layers of the reflectors form top and bottom conductive bridges.
Figure 10:
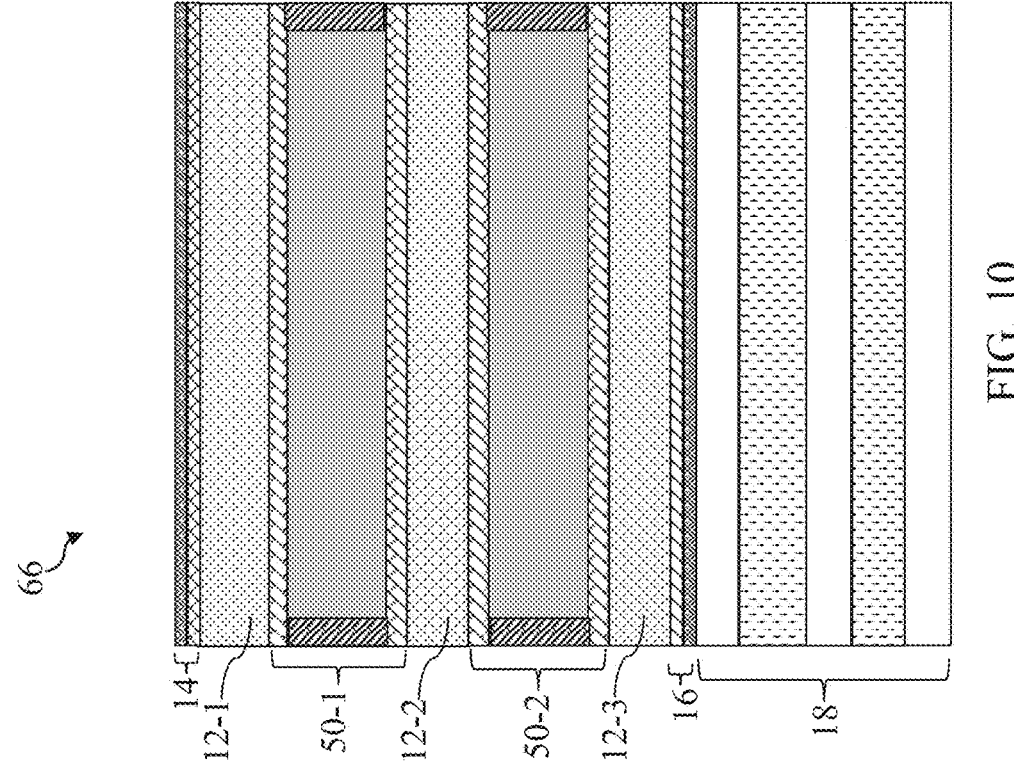
FIG. 10 illustrates a BAW resonator with three piezoelectric layers of the same polarity and two coupler layers embedded therebetween for high order mode operation.

The disclosed resonator structure configuration by inserting a coupler layer between adjacent piezoelectric layers can be extended to include more than two piezoelectric layers in which case an eigenmode of order higher than that as shown in FIG. 9 can be excited. FIGS. 10 and 11 illustrate two of such resonator structures.

FIG. 10 illustrates a cross-sectional view of a BAW resonator 66 that includes an extra piezoelectric layer and an extra coupler layer compared to the BAW resonator 48 of FIG. 6. The BAW resonator 66 includes three piezoelectric layers 12-1, 12-2, 12-3 and two coupler layers 50-1, 50-2. The extra piezoelectric layer 12-3 is substantially similar to either of the piezoelectric layers 12-1 and 12-2. Either of the coupler layers 50-1 and 50-2 is substantially similar to the coupler layer 50 discussed above. The coupler layer 50-1 is inserted between the piezoelectric layers 12-1, 12-2. The coupler layer 50-2 is inserted between the piezoelectric layers 12-2, 12-3. The three piezoelectric layers 12-1, 12-2, 12-3 have the same polarity. The thickness of the coupler layers 50-1, 50-2 is selected such that approximately a half wavelength of the stress profile is fit in each dielectric layer 52 in the respective coupler layer. The structure supports a higher order mode such that the stress field in the three piezoelectric layers 12-1, 12-2, 12-3 point in the same direction and opposite to the field in the sandwiched dielectric layers in the coupler layers 50-1, 50-2 at the desired resonance frequency.

FIG. 11 illustrates a cross-sectional view of a BAW resonator 68 that includes an extra piezoelectric layer and an extra coupler layer compared to the BAW resonator 60 of FIG. 7. Similar to the BAW resonator 66 of FIG. 10, the thickness of the coupler layers 50-1, 50-2 is selected such that approximately a half wavelength of the stress profile is fit in the dielectric layer 52 in the respective coupler layer. The structure supports a higher order mode such that the stress field in the three piezoelectric layers 12-1, 12-2, 12-3 point in the same direction and opposite to the field in the sandwiched dielectric layers in the coupler layers 50-1, 50-2 at the desired resonance frequency.

With more than two cascaded piezoelectric layers in series and even higher order mode of operation, the resonator structures in FIGS. 10 and 11 allow even larger resonator area and further reduced power density. The exemplary acoustic resonator structures in FIGS. 10 and 11 has approximately three times the area of a conventional resonator operating at the fundamental mode, and therefore one third of the power density. While three piezoelectric layers and two coupler layers therebetween are shown in FIGS. 10 and 11, an acoustic resonator structure may have N piezoelectric layers and (N−1) coupler layers therebetween with N as an integer equal to or larger than 2. For example, N may equal 3, 4, 5, or 6 in some examples.

Those skilled in the art will recognize improvements and modifications to the preferred embodiments of the present disclosure. All such improvements and modifications are considered within the scope of the concepts disclosed herein and the claims that follow.

What is claimed is:

1. A bulk acoustic wave (BAW) resonator, comprising:
a first piezoelectric layer;
a second piezoelectric layer, wherein the first piezoelectric layer and the second piezoelectric layer have a same polarity;
a coupler layer between the first piezoelectric layer and the second piezoelectric layer, wherein the coupler layer includes a first metal layer, a second metal layer, a dielectric layer between the first metal layer and the second metal layer, and at least one conductive via electrically connecting the first metal layer and the second metal layer, wherein the at least one conductive via forms a ring extending around a perimeter of the dielectric layer;
a first electrode on the first piezoelectric layer opposite the coupler layer; and
a second electrode on the second piezoelectric layer opposite the coupler layer.

2. The BAW resonator of claim 1, wherein the at least one conductive via is one of a plurality of conductive vias extending through the dielectric layer.

3. The BAW resonator of claim 1, wherein the dielectric layer includes a dielectric material having a positive temperature coefficient of velocity (TCV).

4. The BAW resonator of claim 1, wherein the dielectric layer is an oxide layer.

5. The BAW resonator of claim 1, wherein the BAW resonator is configured to excite a high order mode through the first piezoelectric layer, the coupler layer, and the second piezoelectric layer.

6. The BAW resonator of claim 5, wherein a stress profile of the high order mode has approximately a first half wavelength in the first piezoelectric layer, approximately a second half wavelength in the coupler layer, and approximately a third half wavelength in the second piezoelectric layer.

7. The BAW resonator of claim 5, wherein a stress profile of the high order mode has magnitudes of a first sign in the first piezoelectric layer and the second piezoelectric layer and magnitudes of a second sign opposite to the first sign in the coupler layer.

8. The BAW resonator of claim 1, further comprising:
a first reflector on the first electrode opposite the first piezoelectric layer.

9. The BAW resonator of claim 8, further comprising:
a second reflector on the second electrode opposite the second piezoelectric layer.

10. The BAW resonator of claim 8, wherein the first reflector includes a metal layer proximate the first electrode, a first conductive via connecting the metal layer to a first end of the first electrode, and a second conductive via connecting the metal layer to a second end of the first electrode.

11. The BAW resonator of claim 10, wherein the first reflector further includes an insulating layer between the metal layer and the first electrode.

12. A bulk acoustic wave (BAW) resonator, comprising:
a first piezoelectric layer;
a second piezoelectric layer, wherein the first piezoelectric layer and the second piezoelectric layer have a same polarity;
a coupler layer between the first piezoelectric layer and the second piezoelectric layer;
a first electrode on the first piezoelectric layer opposite the coupler layer; and
a second electrode on the second piezoelectric layer opposite the coupler layer,
wherein a stress profile of a high order mode of the BAW resonator has magnitudes of a first sign in the first piezoelectric layer and the second piezoelectric layer, the stress profile has magnitudes of a second sign in the coupler layer, and the first sign is opposite to the second sign.

13. The BAW resonator of claim 12, wherein the stress profile has a sinusoid portion through the first piezoelectric layer, the coupler layer, and the second piezoelectric layer with a first half wavelength in the first piezoelectric layer, a second half wavelength in the coupler layer, and a third half wavelength in the second piezoelectric layer.

14. The BAW resonator of claim 12, wherein the first piezoelectric layer and the second piezoelectric layer have a same material composition.

15. The BAW resonator of claim 12, wherein the coupler layer includes a first metal layer, a second metal layer, a dielectric layer or a piezoelectric layer between the first metal layer and the second metal layer, and at least one conductive via electrically connecting the first metal layer and the second metal layer.

16. The BAW resonator of claim 12, wherein the coupler layer includes a first metal layer, a second metal layer, and a conductive layer between the first metal layer and the second metal layer.

17. The BAW resonator of claim 12, further comprising:
a Bragg reflector positioned proximate the first electrode.

18. An acoustic resonator structure, comprising:
a first piezoelectric layer;
a second piezoelectric layer;
a third piezoelectric layer;
a first coupler layer between the first piezoelectric layer and the second piezoelectric layer;
a second coupler layer between the second piezoelectric layer and the third piezoelectric layer;
a first electrode on the first piezoelectric layer opposite the first coupler layer; and
a second electrode on the second piezoelectric layer opposite the second coupler layer.

19. The acoustic resonator structure of claim 18, wherein the first piezoelectric layer, the second piezoelectric layer, and the third piezoelectric layer have a same polarity.

20. The acoustic resonator structure of claim 18, wherein each of the first coupler layer and the second coupler layer includes a first metal layer, a second metal layer, a dielectric layer between the first metal layer and the second metal layer, and a conductive feature electrically connecting the first metal layer and the second metal layer.

21. The acoustic resonator structure of claim 18, wherein each of the first coupler layer and the second coupler layer includes a first metal layer, a second metal layer, a piezo-electric layer between the first metal layer and the second metal layer, and a conductive feature electrically connecting the first metal layer and the second metal layer.

22. The acoustic resonator structure of claim 18, wherein each of the first coupler layer and the second coupler layer includes a first metal layer, a second metal layer, and a conductive layer between the first metal layer and the second metal layer.

\* \* \* \* \*